United States Patent
Zhou et al.

(10) Patent No.: US 12,433,030 B2
(45) Date of Patent: Sep. 30, 2025

(54) DISPLAY APPARATUS AND ELECTRONIC DEVICE

(71) Applicant: HKC Corporation Limited, Guangdong (CN)

(72) Inventors: Luhong Zhou, Guangdong (CN); Mingliang Wang, Guangdong (CN); Ruidi Ran, Guangdong (CN); Junfeng Xie, Guangdong (CN)

(73) Assignee: HKC CORPORATION LIMITED, Guangdong (CN)

( * ) Notice: Subject to any disclaimer, the term of this patent is extended or adjusted under 35 U.S.C. 154(b) by 0 days.

(21) Appl. No.: 18/645,911

(22) Filed: Apr. 25, 2024

(65) Prior Publication Data

US 2024/0413170 A1 Dec. 12, 2024

(30) Foreign Application Priority Data

Jun. 8, 2023 (CN) .......................... 202310673717.1

(51) Int. Cl.
*G09G 3/36* (2006.01)
*G09G 3/32* (2016.01)
(Continued)

(52) U.S. Cl.
CPC ............... *H10D 86/60* (2025.01); *G09G 3/32* (2013.01); *G09G 3/3677* (2013.01);
(Continued)

(58) Field of Classification Search
CPC ..... G09G 2330/023; G09G 2310/0251; G09G 2320/0257; G09G 2330/021;
(Continued)

(56) References Cited

U.S. PATENT DOCUMENTS 11,798,483 B1 * 10/2023 Ha .................. G09G 3/3258
2007/0234152 A1    10/2007 Kwon et al.
(Continued)

FOREIGN PATENT DOCUMENTS

CN    101192381 A  *  6/2008
CN    103345094 A     10/2013
(Continued)

OTHER PUBLICATIONS

The first office action issued in corresponding CN application No. 202310673717.1 dated Jul. 12, 2023.

*Primary Examiner* — Dismery Mercedes
(74) *Attorney, Agent, or Firm* — Scully, Scott, Murphy & Presser, P.C.

(57) ABSTRACT

A display apparatus and an electronic device are provided in the disclosure. The display apparatus includes N scan lines extending in a row direction and arranged in a column direction and N rows of sub-pixel units electrically connected to the N scan lines in one-to-one correspondence. The display apparatus further includes at least one parasitic capacitance charge-sharing circuit. For each of the at least one parasitic capacitance charge-sharing circuit, the parasitic capacitance charge-sharing circuit is disposed between corresponding two adjacent scan lines, a time point at which a former scan line of the two adjacent scan lines completes reception of a scan signal precedes a time point at which a latter scan line of the two adjacent scan lines begins reception of a scan signal by a scan-period interval.

12 Claims, 5 Drawing Sheets

(51) Int. Cl.
*H10D 86/40* (2025.01)
*H10D 86/60* (2025.01)
*H01L 25/16* (2023.01)

(52) U.S. Cl.
CPC ... *H10D 86/441* (2025.01); *G09G 2310/0267* (2013.01); *G09G 2310/062* (2013.01); *G09G 2310/08* (2013.01); *G09G 2320/0219* (2013.01); *G09G 2320/0257* (2013.01); *G09G 2330/021* (2013.01); *G09G 2330/04* (2013.01); *H01L 25/167* (2013.01)

(58) Field of Classification Search
CPC ............ G09G 2330/04; G09G 3/3696; G09G 3/3674; G09G 3/3677; G09G 3/3688; G09G 3/32; G09G 2310/0278; G09G 2310/062; G09G 2310/08; G09G 2320/0238; G09G 2320/02; H10D 86/441; H10D 86/60

See application file for complete search history.

(56) References Cited

U.S. PATENT DOCUMENTS

| | | | | |
|---|---|---|---|---|
| 2010/0245301 | A1* | 9/2010 | Shang | G09G 3/3677 345/204 |
| 2010/0315322 | A1* | 12/2010 | Cheng | G09G 3/3611 345/99 |
| 2012/0032941 | A1* | 2/2012 | Chen | G09G 3/3677 345/212 |
| 2014/0347255 | A1* | 11/2014 | Chiu | G09G 3/32 345/82 |
| 2015/0339999 | A1* | 11/2015 | Zheng | G11C 19/28 377/64 |
| 2016/0098966 | A1* | 4/2016 | Kim | G09G 3/3614 345/690 |
| 2016/0217727 | A1* | 7/2016 | Guo | G11C 19/28 |
| 2017/0032740 | A1 | 2/2017 | Ko et al. | |
| 2017/0032755 | A1* | 2/2017 | Ko | G09G 3/3648 |
| 2018/0301074 | A1* | 10/2018 | Shi | G09G 3/20 |
| 2019/0096304 | A1 | 3/2019 | Hu | |
| 2019/0096351 | A1* | 3/2019 | Li | G09G 3/3677 |
| 2019/0147795 | A1* | 5/2019 | Yao | G09G 3/32 345/691 |
| 2020/0058260 | A1* | 2/2020 | Chen | G09G 3/3677 |

FOREIGN PATENT DOCUMENTS

| | | |
|---|---|---|
| CN | 104252841 A | 12/2014 |
| CN | 106531115 A | 3/2017 |
| CN | 115132129 A | 9/2022 |
| CN | 116189608 A | 5/2023 |

* cited by examiner

DISPLAY APPARATUS AND ELECTRONIC DEVICE

CROSS-REFERENCE TO RELATED APPLICATION

This application claims priority under 35 U.S.C. § 119(a) to Chinese Patent Application No. 202310673717.1, filed Jun. 8, 2023, the entire disclosure of which is incorporated herein by reference.

TECHNICAL FIELD

The disclosure relates to the field of display technology, and more particularly, to a display apparatus and an electronic device.

BACKGROUND

A light-emitting diode (LED) display screen includes multiple lamp panels for display. The lamp panel is a printed circuit board (PCB), and parasitic capacitors may exist among wirings of the PCB. As the LED display screen has evolved to have increasingly smaller pixel pitches, the wirings of PCB become more and more dense. Additionally, light-emitting elements of the LED display screen themselves have parasitic capacitors. As a result, a large amount of parasitic capacitors may easily cause abnormal display of the LED display screen, such as upper ghosting, lower ghosting, open-circuit cross, short-circuit caterpillar, appearance of dark lines in the top row, and high contrast coupling.

SUMMARY

To achieve the above object, in a first aspect of the disclosure, a display apparatus is provided. The display apparatus includes N scan lines extending in a row direction and arranged in a column direction and N rows of sub-pixel units electrically connected to the N scan lines in one-to-one correspondence. The N scan lines are configured to sequentially receive scan signals according to a preset time sequence to perform progressive scan on the N rows of sub-pixel units, where N is greater than or equal to two. The display apparatus further includes at least one parasitic capacitance charge-sharing circuit. For each of the at least one parasitic capacitance charge-sharing circuit, the parasitic capacitance charge-sharing circuit is disposed between corresponding two adjacent scan lines. A time point at which a former scan line of the two adjacent scan lines completes reception of a scan signal precedes a time point at which a latter scan line of the two adjacent scan lines begins reception of a scan signal by a scan-period interval. The parasitic capacitance charge-sharing circuit is configured to electrically connect the corresponding two adjacent scan lines with each other in at least part of time periods within the scan-period interval, so that parasitic capacitance charges on the former scan line of the corresponding two adjacent scan lines are discharged to the latter scan line of the corresponding two adjacent scan lines through the parasitic capacitance charge-sharing circuit.

In a second aspect of the disclosure, an electronic device is further provided. The electronic device includes a housing, a power supply module, and the display apparatus provided in the first aspect. The power supply module is electrically connected to the display apparatus. The power supply module is configured to power the display apparatus. The housing is configured to fix the display apparatus and the power supply module.

Additional aspects and advantages of the disclosure will be partially provided in the following illustration, while others will become apparent from the following illustration, or be learned through the practice of the disclosure.

Figure 1:
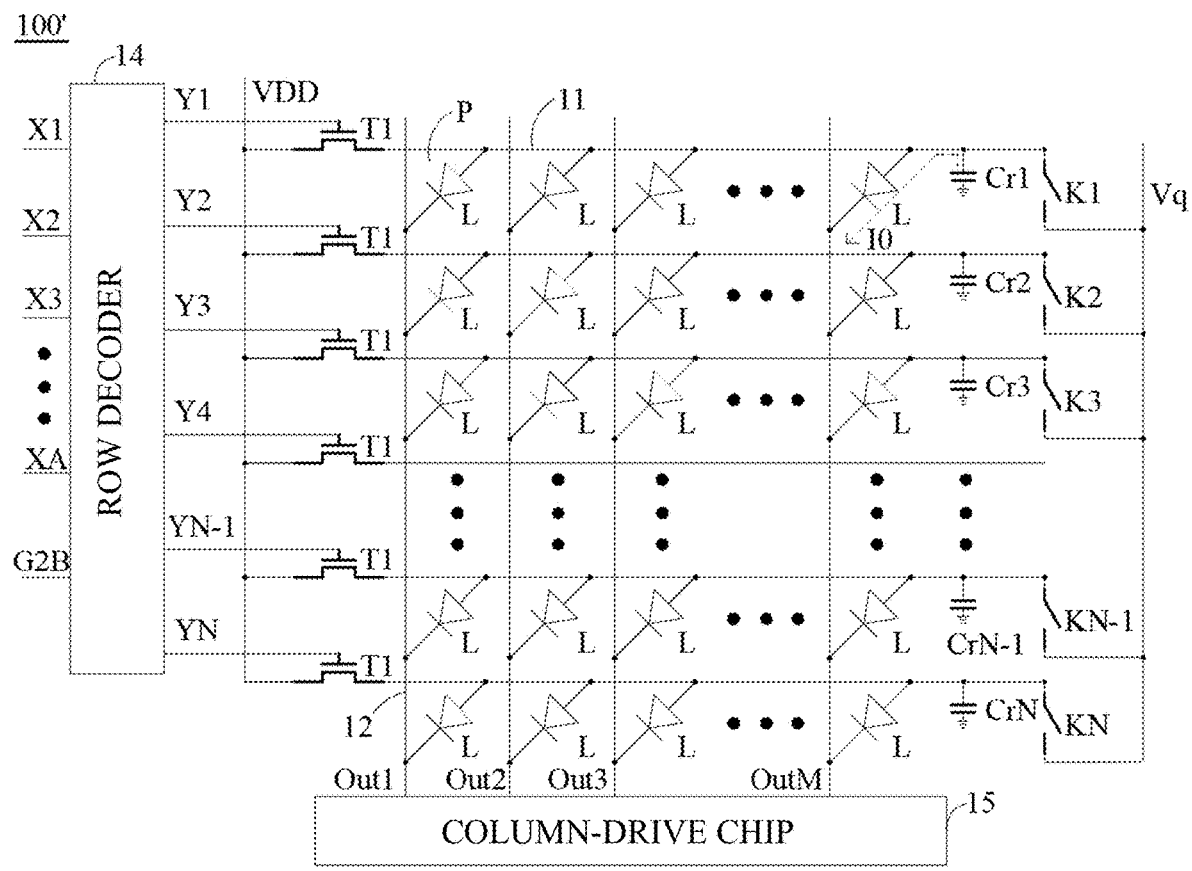
FIG. 1 is a schematic structural diagram of a display apparatus provided in implementations of the disclosure.

Reference numerals are described as follows:
100—display apparatus; 100'—display apparatus; 11—scan line; 12—data line; P—sub-pixel unit; L—light-emitting element; 13—parasitic capacitance charge-sharing circuit; 131—switch module; 132—control circuit; 1321—first voltage input terminal; 1322—second voltage input terminal; 1323—enable-signal input terminal; 1324—conduction signal output terminal; U1—comparator; T1—row-drive transistor; T2—reset transistor; 14—row decoder; 15—column-drive chip; K1—bleeder switch; 1—electronic device; 200—housing; 300—power supply module.

The following detailed description will further illustrate the disclosure with reference to the drawings.

DETAILED DESCRIPTION

Technical solutions in implementations of the disclosure will be described clearly and completely hereinafter with reference to the accompanying drawings described. Apparently, the described implementations are merely some rather than all implementations of the disclosure. All other implementations obtained by those of ordinary skill in the art based on the implementations of the disclosure without creative efforts shall fall within the protection scope of the disclosure.

It may be noted that in illustration of the disclosure, terms "first", "second", and the like are only used for illustration and cannot be understood as explicitly or implicitly indicating relative importance.

In view of above, the disclosure aims to provide a display apparatus and an electronic device, to solve a problem of abnormal display in existing display screens caused by parasitic capacitors among wirings.

Referring to FIG. 1, in the related art, the display apparatus 100' includes N scan lines 11 (also referred to as row-drive lines) extending in a row direction and arranged in a column direction, M data lines 12 (also referred to as column driving lines) extending in the column direction and arranged in the row direction, and multiple sub-pixel units P positioned at intersections between the N scan lines 11 and the M data lines 12. Each of the scan lines 11 is configured to output a scan signal to a corresponding row of sub-pixel units P to perform progressive scan on the N rows of sub-pixel units P. Each of the data lines 12 is configured to output corresponding a data signal to a corresponding column of sub-pixel units P. Optionally, the display apparatus 100' further includes a column-drive chip 15 electrically connected to the M data lines 12. The column-drive chip 15 is configured to provide a corresponding data signal to each data line 12.

Each sub-pixel unit P includes a light-emitting element L. The light-emitting element L includes an anode and a cathode. The anode of the light-emitting element L is electrically connected to the scan line 11 corresponding to the sub-pixel unit P, and the cathode of the light-emitting element L is electrically connected to the data line 12 corresponding to the sub-pixel unit P. The light-emitting element L is configured to receive a scan signal VDD through the scan line 11, to receive a corresponding data signal through the data line 12, and to emit light under the drive of the scan signal VDD and the data signal. In the implementations of the disclosure, the light-emitting element L may be a light-emitting diode (LED), a Micro LED, or a Mini LED.

Figure 2:
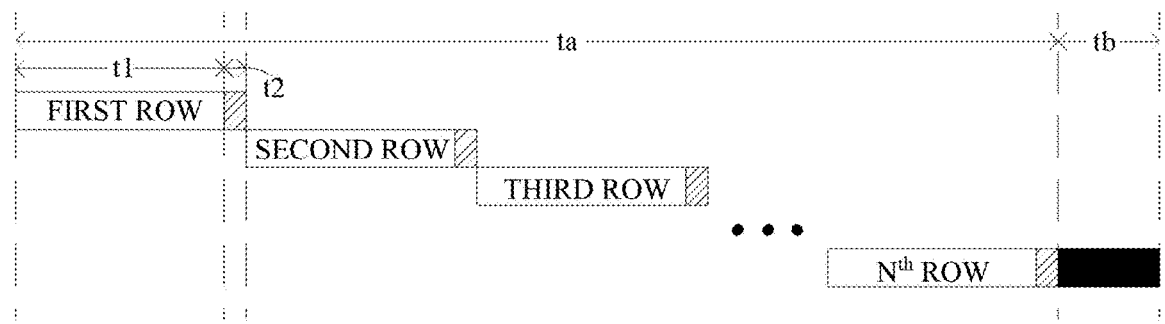
FIG. 2 is a timing diagram of a frame of display image provided in an implementation of the disclosure.

During operation, the display apparatus 100' adopts a progressive scan display mode. As illustrated in FIG. 2, each frame of display image has a display period ta and a vertical blanking interval tb. The display period ta of each frame of display image is divided into N segments, where N is equal to the number of rows of the sub-pixel units P of the display apparatus 100'. In this way, a period of (ta*1/N) is allocated to each row of sub-pixel units P. Within the period of (ta*1/N) for performing progressive scan on one row of sub-pixel units P, M sub-pixel units P of the one row of sub-pixel units P will display corresponding gray scales according to a data signal received.

Due to dense wirings of the display apparatus 100', parasitic capacitors may exist among wirings. For example, as illustrated in FIG. 1, Cr1, Cr2, Cr3, and so forth, up to CrN−1, and CrN represent a parasitic capacitor of the first row of scan line 11, a parasitic capacitor of the second row of scan line 11, a parasitic capacitor of the third row of scan line 11, and so forth, up to a parasitic capacitor of the $(N-1)^{th}$ row of scan line 11, and a parasitic capacitor of the $N^{th}$ row of scan line 11, respectively. It may be understood that, denser arrangement of the sub-pixel units P of the display apparatus 100' corresponds to greater parasitic capacitance of the scan line 11. Consequently, it may easily cause abnormal display of the display apparatus 100', such as upper ghosting, lower ghosting, open-circuit cross, short-circuit caterpillar, appearance of dark lines in the top row, and high contrast coupling. For example, during scanning of the first row of sub-pixel units P, the first row of scan line 11 is charged to a voltage VDD, each of the first row of sub-pixel units P receives a corresponding data signal through a respective data line for display. When the scanning of the first row of sub-pixel units P is completed, charges in the parasitic capacitor Cr1 remain at the voltage VDD due to the absence of a discharge path. During scanning of the second row of sub-pixel units P, each data line 12 receives a corresponding data signal to be at a low potential. In this case, a voltage across the parasitic capacitor Cr1 remains at the voltage VDD, and thus the anode of the light-emitting element L of the first row of sub-pixel units P remains at the voltage VDD. At this point, the anode of the light-emitting element L of the first row of sub-pixel units P is at a high potential, and the cathode of the light-emitting element L of the first row of sub-pixel units P connected to a corresponding data line 12 is at a low potential, so that the first row of sub-pixel units P may be subject to slight conduction, leading to undesired light emission (for example, a discharging current of the last one of the first row of sub-pixel units P is I0). The undesired light emission does not cease until the electric charges in the parasitic capacitor Cr1 are sufficiently discharged. This phenomenon is referred to as upper ghosting.

Figure 3:
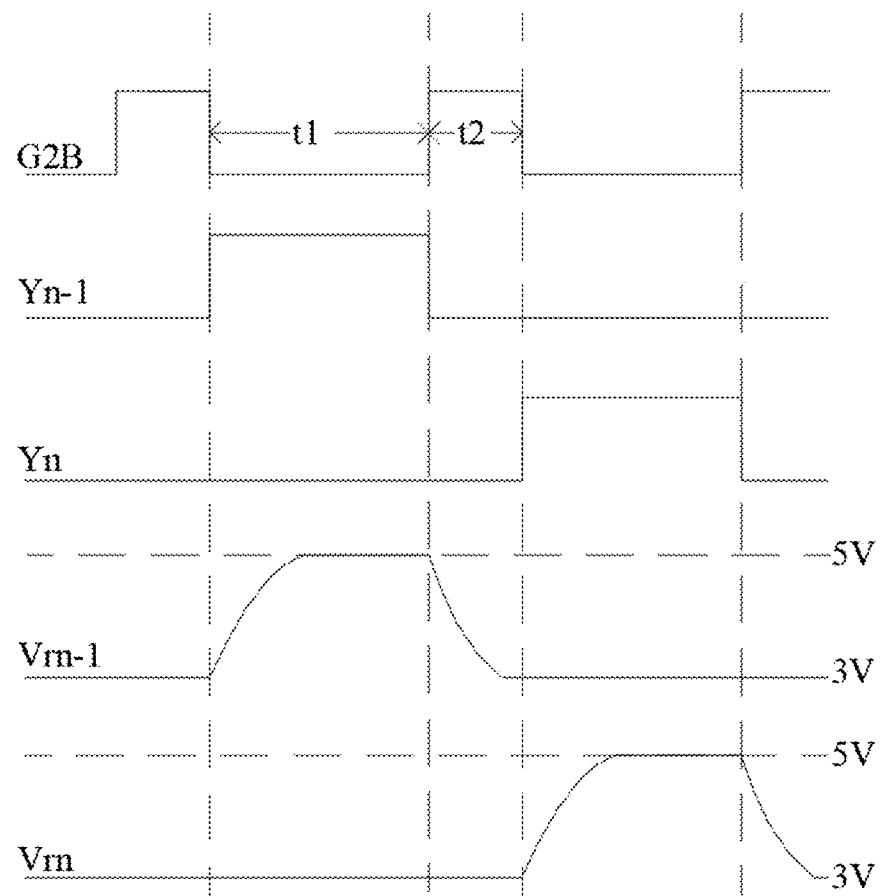
FIG. 3 is a waveform diagram of part of signals of the display apparatus in FIG. 1.

In order to solve abnormal display of the display apparatus 100' caused by parasitic capacitors, in some implementations, a bleeder power supply Vq with a constant voltage is externally connected to discharge electric charges in the parasitic capacitor of the scan line 11. As illustrated in FIGS. 1 and 2, each scan line 11 is connected to one bleeder switch. One end of the bleeder switch is electrically connected to a corresponding scan line 11, and another end of the bleeder switch is electrically connected to the bleeder power supply Vq. For example, the first scan line 11 corresponds to a bleeder switch K1. A scan-period interval t2 is defined between a scanning of the previous row of sub-pixel units P and a scanning of the next row of sub-pixel units P. That is, a total period of scanning of each row of sub-pixel units P includes a scan period t1 and the scan-period interval t2. After the scanning of each row of sub-pixel units P is completed, the bleeder switch corresponding to the row of sub-pixel units P is switched on to electrically connect the corresponding scan line 11 to the bleeder power supply Vq, so that charges in the parasitic capacitor of the scan line 11 can be discharged to the bleeder power supply Vq. Exemplarily, as illustrated in FIG. 3, a voltage waveform of the $(n-1)^{th}$ row of scan line 11 is Vrn−1, and a voltage waveform of the $(n)^{th}$ row of scan line 11 is Vrn. During scanning of the $(n-1)^{th}$ row of sub-pixel units P, a voltage of the $(n-1)^{th}$ row of scan line 11 rises from Vq (e.g., 3 V) to VDD (e.g., 5V) within the scan period t1. Once the scan period t1 expires, the scan-period interval t2 begins, a bleeder switch Kn−1 corresponding to the $(n-1)^{th}$ row of scan line 11 is switched on to electrically connect the corresponding scan line 11 to the bleeder power supply Vq, so that charges in the parasitic capacitor Crn−1 can be discharged to the bleeder power supply Vq. Once the scan-period interval t2 expires, a scanning of the $n^{th}$ row of sub-pixel units P begins. This cycle allows charges in the parasitic capacitor of each scan line 11 to be discharged, thereby solving abnormal display of the display apparatus 100' caused by the parasitic capacitors. However, this manner may not only prolong blanking time which may results in reduced luminous efficiency, but also wastes power.

Figure 4:
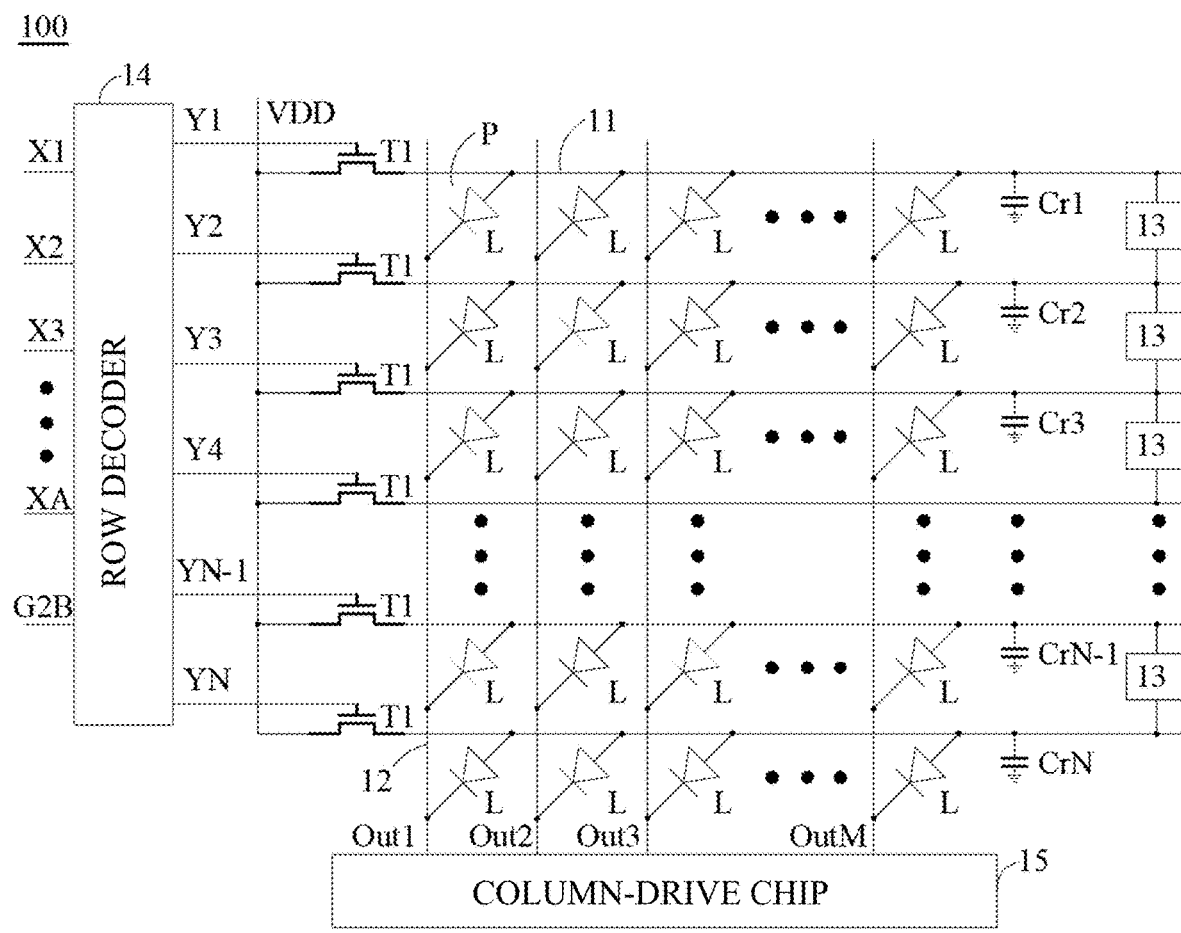
FIG. 4 is a schematic structural diagram of a display apparatus provided in implementations of the disclosure.

In view of above, as illustrated in FIG. 4, a display apparatus 100 is provided in the disclosure. The display apparatus 100 includes N scan lines 11 extending in a row direction and arranged in a column direction, and N rows of sub-pixel units P electrically connected to the N scan lines 11 in one-to-one correspondence. The N scan lines 11 are configured to sequentially receive scan signals according to a preset time sequence to perform progressive scan on the N rows of sub-pixel units P, where N≥2.

The preset time sequence can be a time sequence that the N scan lines 11 in one-to-one correspondence with the N rows of sub-pixel units P are configured to sequentially receive scan signals according to the order from the first row to the $N^{th}$ row. The progressive scan on the N rows of sub-pixel units P refers to that from the first row of scan line 11 to the $N^{th}$ row of scan line 11, scan signals are output to the sub-pixel units P connected to the N row of scan lines 11 line by line.

The display apparatus 100 further includes at least one parasitic capacitance charge-sharing circuit 13. For each of the at least one parasitic capacitance charge-sharing circuit 13, the parasitic capacitance charge-sharing circuit 13 is disposed between corresponding two adjacent scan lines 11, a time point at which a former scan line 11 of the two adjacent scan lines 11 completes reception of a scan signal precedes a time point at which a latter scan line 11 of the two adjacent scan lines 11 begins reception of a scan signal by a scan-period interval t2. The parasitic capacitance charge-sharing circuit 13 is configured to electrically connect the corresponding two adjacent scan lines 11 with each other in at least part of time periods within the scan-period interval t2, so that parasitic capacitance charges on the former scan line 11 of the corresponding two adjacent scan lines 11 are discharged to the latter scan line 11 of the corresponding two adjacent scan lines 11 through the parasitic capacitance charge-sharing circuit 13.

Figure 5:
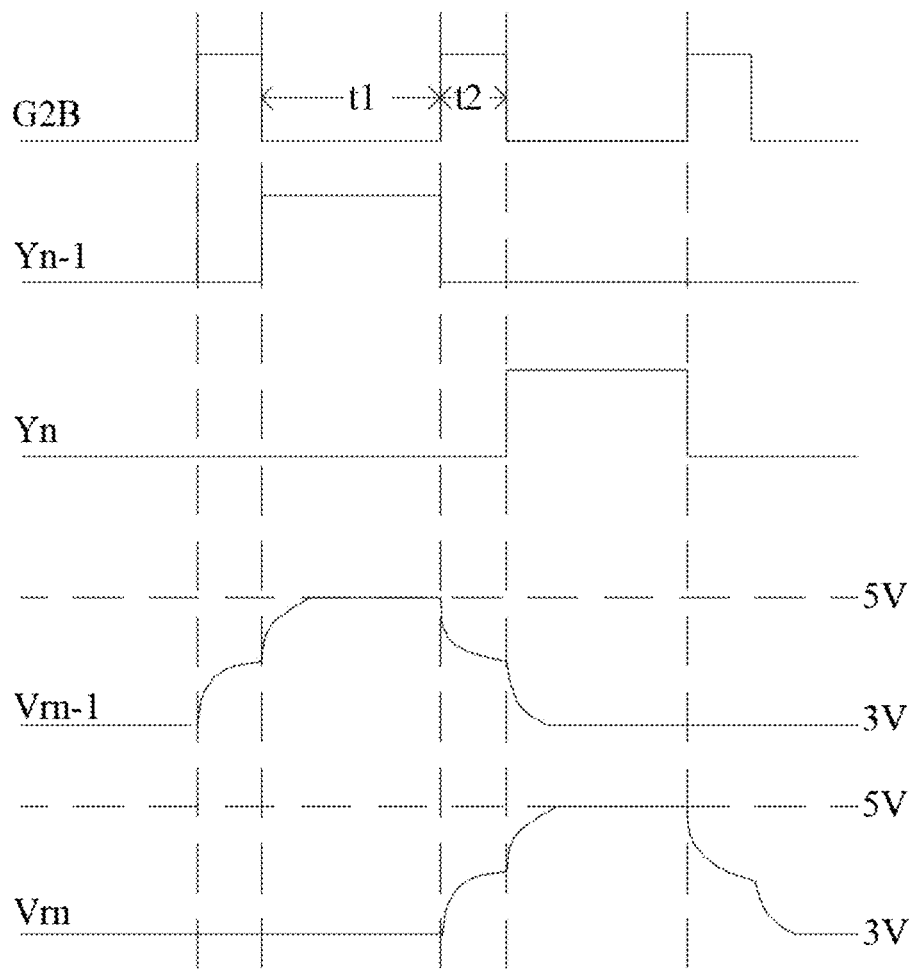
FIG. 5 is a waveform diagram of part of signals of the display apparatus in FIG. 4.

Exemplarily, one parasitic capacitance charge-sharing circuit 13 is arranged between the $(n-2)^{th}$ row of scan line 11 and the $(n-1)^{th}$ row of scan line 11, and another parasitic capacitance charge-sharing circuit 13 is arranged between the $(n-1)^{th}$ row of scan line 11 and the $n^{th}$ row of scan line 11, where N≥n. As illustrated in FIG. 5, within the scan-period interval t2 of the $(n-2)^{th}$ row of sub-pixel units P, the $(n-2)^{th}$ row of scan line 11 is electrically connected to the $(n-1)^{th}$ row of scan line 11 through the corresponding parasitic capacitance charge-sharing circuit 13, so that charges in the parasitic capacitor Crn-2 of the $(n-2)^{th}$ row of scan line 11 can be shared to the $(n-1)^{th}$ row of scan line 11, and thus the $(n-2)^{th}$ row of scan line 11 is discharged to reach a share potential and the $(n-1)^{th}$ row of scan line 11 is charged to reach the share potential. During scanning of the $(n-1)^{th}$ row of sub-pixel units P, a voltage of the $(n-1)^{th}$ row of scan line 11 rises from the shared potential to VDD (e.g., 5 V) within the scan period t1. Once the scan period t1 expires, the scan-period interval t2 begins, the $(n-1)^{th}$ row of scan line 11 is electrically connected to the $n^{th}$ row of scan line 11 through the corresponding parasitic capacitance charge-sharing circuit 13, so that charges in the parasitic capacitor Crn-1 of the $(n-1)^{th}$ row of scan line 11 can be shared to the $n^{th}$ row of scan line 11, and thus the $(n-1)^{th}$ row of scan line 11 is discharged to reach a shared potential and the $n^{th}$ row of scan line 11 is charged to reach the shared potential. When the scan-period interval t2 expires, based on that the $n^{th}$ row of scan line 11 is at the shared potential, the $n^{th}$ row of sub-pixel units P is scanned. In this way, charges in the parasitic capacitor of the previous row of scan line 11 can be shared to the next row of scan line 11 within the scan-period interval t2. This can not only solve abnormal display that is caused by parasitic capacitors, but also can reuse charges in the parasitic capacitors, thereby reducing the energy consumption.

Since a period for scanning of each row of sub-pixel units P is t1, i.e., each row of the sub-pixel units P is configured to display within the scan period t1 and to not display within the scan-period interval t2, and the luminous efficiency $\eta=t1/(t1+t2)$. From a comparison between voltage waveforms of scan lines 11 in FIG. 3 and voltage waveforms of scan lines 11 in FIG. 5, it can be seen that, in the display apparatus 100 provided in the disclosure, during scanning of the latter scan line 11 of the two adjacent scan lines 11, charges on the former scan line 11 of the two adjacent scan lines 11 can be shared to the latter scan line 11 to rise a voltage of the latter scan line 11 to VDD. This can speed up conduction of the latter scan line 11, thereby shortening the scan-period interval t2, and further improving the luminous efficiency $\eta$.

According to the display apparatus 100 provided in the disclosure, at least one parasitic capacitance charge-sharing circuit 13 is arranged between two adjacent scan lines 11, and the parasitic capacitance charge-sharing circuit 13 can be controlled to electrically connect the corresponding two adjacent scan lines 11 with each other in at least part of time periods within the scan-period interval t2, so that parasitic capacitor charges on the former scan line 11 of the corresponding two adjacent scan lines 11 can be discharged to the latter scan line 11 of the corresponding two scan lines 11 through the parasitic capacitance charge-sharing circuit 13. This can not only solve abnormal display that is caused by parasitic capacitors, but also can achieve reuse of charges in the parasitic capacitors, thereby reducing the energy consumption, and the scan-period interval t2 can also be shortened, thereby improving the light-emitting efficiency.

Optionally, as illustrated in FIG. 4, in the implementations of the disclosure, a number of the at least one parasitic capacitance charge-sharing circuit 13 is N−1, and one of the at least one parasitic capacitance charge-sharing circuit 13 is disposed between each two adjacent scan lines 11. In some implementations, the number of the at least one parasitic capacitance charge-sharing circuit 13 can also be less than N−1, i.e., the parasitic capacitance charge-sharing circuit 13 may be absent between some two adjacent scan lines 11. In some implementations, multiple parasitic capacitance charge-sharing circuits 13 may also be arranged between each two adjacent scan lines 11.

Figure 6:
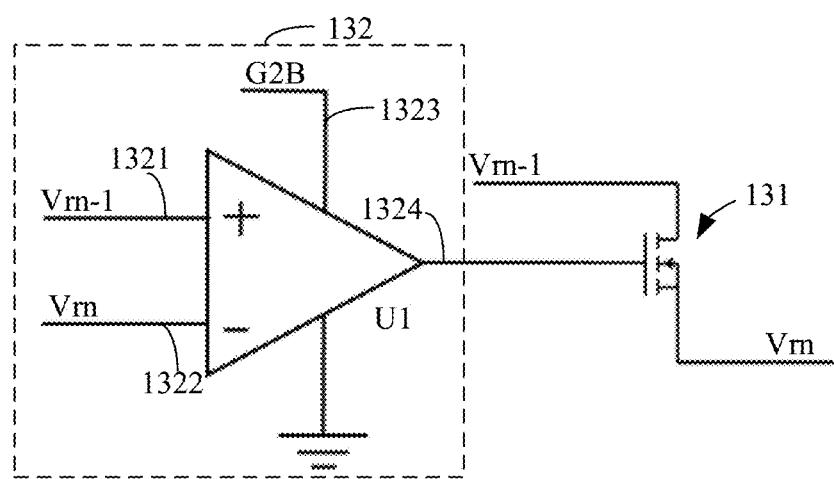
FIG. 6 is a circuit diagram of a parasitic capacitance charge-sharing circuit in FIG. 4.

Further, as illustrated in FIG. 6, each of the at least one the parasitic capacitance charge-sharing circuit 13 includes a switch module 131. The switch module 131 is arranged between and connected to two adjacent scan lines 11 corresponding to the parasitic capacitance charge-sharing circuit 13. The switch module 131 is configured to be switched on in at least part of time periods within the scan-period interval t2 to electrically connect the two adjacent scan lines 11 corresponding to the parasitic capacitance charge-sharing circuit 13 with each other.

Further, the switch module 131 includes a control terminal, a first connection terminal, and a second connection terminal. The first connection terminal of the switch module 131 is electrically connected to the former scan line 11 of the two adjacent scan lines 11 corresponding to the parasitic capacitance charge-sharing circuit 13. The second connection terminal of the switch module 131 is electrically connected to the latter scan line 11 of the two adjacent scan lines 11 corresponding to the parasitic capacitance charge-sharing circuit 13.

Exemplarily, the switch module 131 may be a thin film transistor (TFT), an amorphous silicon thin film transistor (a-Si TFT), a low temperature polycrystalline silicon thin film transistor (LTPS TFT), or an oxide semiconductor thin film transistor (Oxide TFT). The first connection terminal of each switch module 131 serves as a drain electrode of the TFT, the second connection terminal of each switch module 131 serves as a source electrode of the TFT, and the control terminal of each switch module 131 serves as a gate electrode of the TFT.

The parasitic capacitance charge-sharing circuit 13 further includes a control circuit 132 connected to the control terminal of the switch module 131 of the parasitic capacitance charge-sharing circuit 13. The control circuit 132 is configured to detect a voltage difference between the two adjacent scan lines 11 corresponding to the parasitic capacitance charge-sharing circuit 13 and determine whether the scan-period interval t2 for scanning the two adjacent scan lines 11 corresponding to the parasitic capacitance charge-sharing circuit 13 reaches, and to output a conduction signal to the control terminal of the switch module 131 to switch the switch module on in response to that the voltage difference between the two adjacent scan lines 11 meets a preset condition and the scan-period interval t2 for scanning the two adjacent scan lines 11 corresponding to the parasitic capacitance charge-sharing circuit 13 reaches, to electrically connect the two adjacent scan lines 11 with each other. The preset condition is that a voltage of the former scan line 11 of the two adjacent scan lines 11 is higher than a voltage of the latter scan line 11 of the two adjacent scan lines 11.

Further, as illustrated in FIGS. 5-6, the control circuit 132 includes a first voltage input terminal 1321, a second voltage input terminal 1322, an enable-signal input terminal 1323, and a conduction signal output terminal 1324.

The first voltage input terminal 1321 is electrically connected to the former scan line 11 of the two adjacent scan lines 11 corresponding to the parasitic capacitance charge-sharing circuit 13.

The second voltage input terminal 1322 is electrically connected to the latter scan line 11 of the two adjacent scan lines 11 corresponding to the parasitic capacitance charge-sharing circuit 13.

The enable-signal input terminal 1323 is configured to receive a parasitic capacitance charge-sharing enable signal.

As illustrated in FIG. 5, a level of the parasitic capacitance charge-sharing enable signal is a second level during reception of a scan signal by any scan line 11 and is a first level within the scan-period intervals t2. In the implementations of the disclosure, the first level is a high level, and the second level is a low level.

The conduction signal output terminal 1324 is electrically connected to the control terminal of the switch module 131 of the parasitic capacitance charge-sharing circuit 13.

The control circuit 132 is configured to output the conduction signal to the control terminal of the switch module 131 through the conduction signal output terminal 1324 to switch on the switch module 131 of the parasitic capacitance charge-sharing circuit 13, in response to that the level of the parasitic capacitance charge-sharing enable signal received is the first level and a voltage of the first voltage input terminal 1321 is higher than a voltage of the second voltage input terminal 1322.

Further, in the implementation of the disclosure, the parasitic capacitance charge-sharing circuit 13 is configured to electrically disconnect corresponding two adjacent scan lines 11 from each other within a period from a time point at which a frame of display image begins to a time point at which the former scan line 11 of the corresponding two adjacent scan lines 11 completes reception of the scan signal, and within a period from a time point at which the latter scan line 11 of the corresponding two adjacent scan lines 11 begins reception of the scan signal to a time point at which the frame of display image ends.

Specifically, the control circuit 132 is configured to skip outputting the conduction signal to the control terminal of the switch module 131 in response to that the level of the parasitic capacitance charge-sharing enable signal received is the second level, or that the voltage of the first voltage input terminal 1321 is lower than or equal to the voltage of the second voltage input terminal 1322, to switch off the switch module 131 of the parasitic capacitance charge-sharing circuit 13, so that the parasitic capacitance charge-sharing circuit 13 can electrically disconnect corresponding two adjacent scan lines 11 from each other within a period from a time point at which a frame of display image begins to a time point at which the former scan line 11 of the corresponding two adjacent scan lines 11 completes reception of the scan signal, and within a period from a time point at which the latter scan line 11 of the corresponding two adjacent scan lines 11 begins reception of the scan signal to a time point at which the frame of display image ends.

In this way, whether the scan-period interval t2 reaches is determined based on the parasitic capacitance charge-sharing enable signal, so that the switch module 131 can be switched on only within the scan-period interval t2. It can ensure that when the former scan line 11 of the two adjacent scan lines 11 corresponding to the parasitic capacitance charge-sharing circuit 13 is within the scan period t1, the former scan line 11 of the two adjacent scan lines 11 can be avoided from leaking electricity to the latter scan line 11 of the two adjacent scan lines 11, thereby ensuring display normally of sub-pixel units P corresponding to the former scan line 11 of the two adjacent scan lines 11. In addition, when the voltage of the first voltage input terminal 1321 is lower than or equal to the voltage of the second voltage input terminal 1322, the former scan line 11 and the latter scan line 11 of the two adjacent scan lines 11 are electrically disconnected from each other, thereby preventing the latter scan line 11 from reversely charging the former scan line 11, and ensuring normal display of the sub-pixel units P corresponding to the latter scan line 11.

Further, in an implementation, the control circuit 132 further includes a comparator U1. The comparator U1 includes a positive phase input terminal, a negative phase input terminal, an enable terminal, and an output terminal.

The non-inverting input terminal is electrically connected to the first voltage input terminal 1321. The inverting input terminal is electrically connected to the second voltage input terminal 1322. The enable terminal is electrically connected to the enable-signal input terminal 1323 and configured to receive the parasitic capacitance charge-sharing enable signal. The output terminal is electrically connected to the conduction signal output terminal 1324.

The comparator U1 is configured to output a high level signal to the control terminal of the switch module 131 through the output terminal in response to that the level of the parasitic capacitance charge-sharing enable signal received is the first level and a voltage of the non-inverting input terminal is higher than a voltage of the inverting input terminal, thereby controlling the switch module 131 to electrically connect the two adjacent scan lines 11 with each other, where the high level signal is the conduction signal.

It should be noted that, in this implementation, the switch module 131 is a transistor that is switched on at a high level, the non-inverting input terminal of the comparator U1 is electrically connected to the first voltage input terminal 1321, and the inverting input terminal of the comparator U1 is electrically connected to the second voltage input terminal 1322. In other implementations, the switch module 131 may also be a transistor that is switched on at a low level, the non-inverting input terminal of the comparator U1 is electrically connected to the second voltage input terminal 1322, and the inverting input terminal of the comparator U1 is electrically connected to the first voltage input terminal 1321.

In other implementations, the control circuit 132 may also be other circuits having a voltage comparison function and a timing recognition function, such as a power supply chip, an independent micro controller unit (MCU), a single chip microcomputer, or a digital signal processing (DSP). In this case, the control circuit 132 can determine whether the scan-period interval t2 reaches by synchronizing the control circuit 132 with a timing controller (TCON) of the display apparatus 100. Optionally, the control circuit 132 may also be a circuit including an operational amplifier and a transistor, which is not limited herein.

Further, the display apparatus 100 further includes N row-drive transistors T1 and a row decoder 14.

The N row-drive transistors T1 correspond to the N scan lines 11 in one-to-one correspondence. Each of the N row-drive transistors T1 includes a first connection terminal, a second connection terminal, and a control terminal. The first connection terminal of each of the N row-drive transistors is electrically connected to a scan power supply. The second connection terminal of each of the N row-drive transistors is electrically connected to a corresponding scan line 11.

The row decoder includes multiple decoding input terminals, a decoding enable terminal configured to receive a decoding enable signal, and N row-drive signal output terminals electrically connected to control terminals of the N row-drive transistors in one-to-one correspondence. The row decoder is configured to output N row-drive signals to the control terminals of the N row-drive transistors in one-to-one correspondence to sequentially turn the N row-drive transistors on according to a preset time sequence in response to that the decoding enable signal received is the second level, so that the N scan lines are sequentially electrically connected to the scan power supply through the row-drive transistors that are on to receive scan signals provided by the scan power supply.

Exemplarily, as illustrated in FIG. 4, the multiple decoding input terminals are represented as X1~XA, the decoding enable signal received is represented as G2B, and the N row-drive signals are represented as Y1~YN. The number A of the multiple decoding input terminals is less than the number N of N row-drive signal output terminals. Optionally, the row decoder 14 may include multiple decoders.

The decoding enable signal G2B is configured to control a duration of a time interval between each two adjacent row-drive signals, and the parasitic capacitance charge-sharing enable signal serves as the decoding enable signal G2B.

As illustrated in FIG. 5, when the decoding enable signal G2B is at the second level (that is, the low level), the row decoder 14 sequentially outputs the N row-drive signals Y1 to YN, where the row-drive signal Y1 is outputted to the first scan line 11, and the row-drive signal YN is outputted to the $N^{th}$ scan line 11. When the decoding enable signal G2B is at the first level (that is, the high level), the row decoder 14 stops outputting the row-drive signal. In this way, a duration of the scan-period interval t2 can be controlled by controlling a duration during which the decoding enable signal G2B is at the high level.

In this way, the decoding enable signal G2B can be multiplexed as the parasitic capacitance charge-sharing enable signal of each control circuit 132, and no additional signal generation circuit is required, thereby simplifying the circuit structure.

It may be noted that, in the existing display apparatus, a duration of the display period ta of a frame of display image, a duration of the scan period t1 of each row of sub-pixel units P, and a duration of the scan-period interval t2 are all inversely related to a current refresh rate of the display apparatus. For example, when the current refresh rate is 60 Hz, ta=16 ms, t1=10.6 μs, t2=0.6 μs; when the current refresh rate is 120 Hz, ta=8 ms, t1=5.3 μs, t2=0.3 μs. That is to say, the higher the current refresh rate, the shorter the scan-period interval t2 of each row of sub-pixel units Ps, and thus the shorter a duration in which the switch module 131 is on. In this way, when a refresh frequency is relatively high, due to an excessively short duration of the scan-period interval t2, the duration in which the switch module 131 is on may be too short, and thus insufficient discharge of parasitic capacitors of the former scan line 11 of the two adjacent scan lines 11 corresponding to the switch module 131 may occur.

In view of above, in the implementations of the disclosure, the display apparatus 100 is configured to adjust the duration of the scan-period interval t2 according to the current refresh rate. Specifically, when the current refresh rate is lower than a preset refresh rate threshold, the duration of the scan-period interval t2 is inversely related to the current refresh rate. When the current refresh rate is greater than or equal to the preset refresh rate threshold, the duration of the scan-period interval t2 remains at a preset time interval t0. When the scan-period interval t2 is set as the preset time interval t0, it can ensure sufficient discharge of the parasitic capacitors of the scan lines 11. Both the preset refresh rate threshold and the preset time interval to can be set according to a capacitance value of the parasitic capacitor of the scan line 11, which can be determined through experiments. Exemplarily, the display apparatus 100 may utilize a timing controller or a system on chip (SOC) to identify the current refresh rate, and output a corresponding decoding enable signal G2B and/or the parasitic capacitance charge-sharing enable signal according to the current refresh rate, thereby adjusting the duration of the scan-period interval t2.

Figure 7:
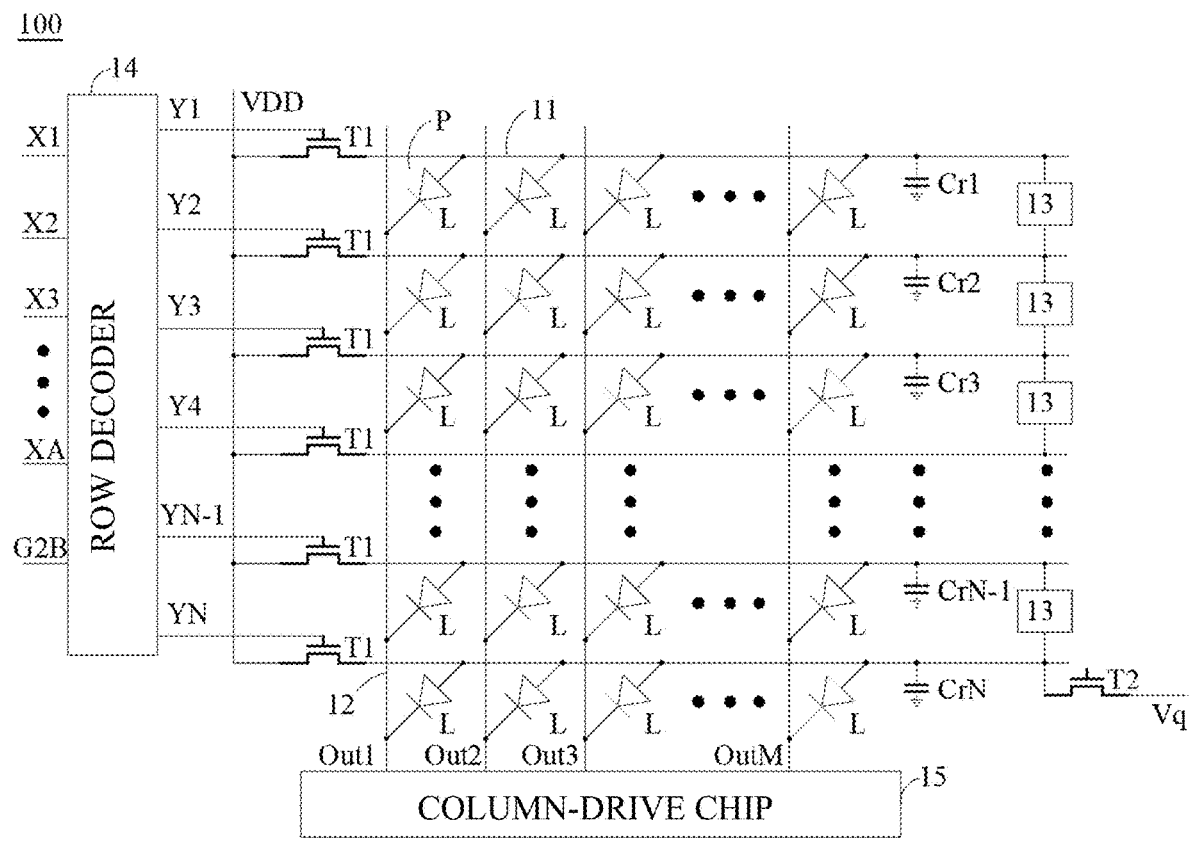
FIG. 7 is a schematic structural diagram of a display apparatus provided in implementations of the disclosure.

Alternatively, referring to FIG. 7, in another implementation, the display apparatus 100 further includes a reset transistor T2. The reset transistor T2 includes a first connection terminal, a second connection terminal, and a control terminal. The first connection terminal of the reset transistor T2 is electrically connected to one of the N scan lines 11. The second connection terminal of the reset transistor T2 is electrically connected to the bleeder power supply Vq.

The reset transistor T2 remains off during the display period ta.

In at least part of periods within the vertical blanking interval tb, both the reset transistor T2 and the switch module 131 of each of the N–1 parasitic capacitance charge-sharing circuits 13 are on, so that the N scan lines 11 are electrically connected to the bleeder power supply Vq through the reset transistor T2 that is on and the switch modules 131 that are onto discharge residual parasitic capacitance charges on the N scan lines 11.

Exemplarily, the reset transistor T2 is disposed between the $N^{th}$ scan line 11 and the bleeder power supply Vq. In this way, the reset transistor T2 remains off during the display period ta, ensuring normal display of the sub-pixel units P in respective rows. In addition, since the sub-pixel units P in the respective rows do not display during the vertical blanking interval tb, residual charges in the parasitic capacitors of the respective scan lines 11 can be discharged through the bleeder power supply Vq. That is, the voltage of each scan line 11 is reset to Vq, ensuring that the voltage of each scan line 11 at the initial time of each frame of display image is Vq, and further improving the display effect.

Figure 8:
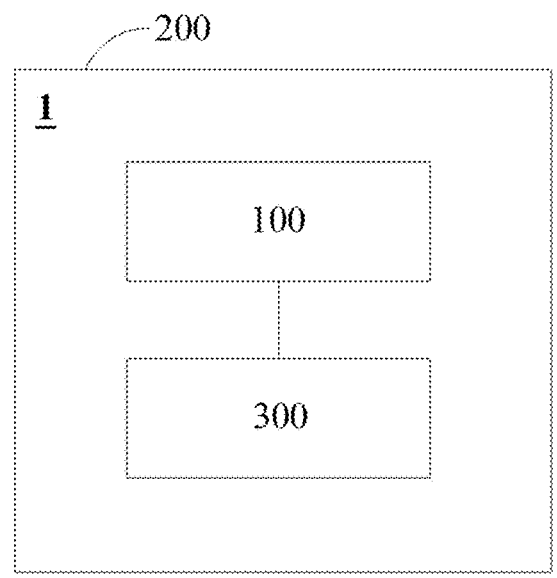
FIG. 8 is a schematic structural diagram of an electronic device provided in an implementation of the disclosure.

As illustrated in FIG. 8, based on the same inventive concept, the disclosure further provides an electronic device 1. The electronic device 1 includes a housing 200, a power supply module 300, and the display apparatus 100 according to any one of the above implementations. The power supply module 300 is electrically connected to the display apparatus. The power supply module 300 is configured to power the display apparatus 100. The housing 200 is configured to fix the display apparatus 100 and the power supply module 300.

Exemplarily, the electronic device 1 may be any electronic product having a display function, such as a notebook computer, a display, a television, a mobile phone, or a tablet computer.

According to the electronic device 1 provided in the disclosure, at least one parasitic capacitance charge-sharing circuit 13 is arranged between two adjacent scan lines 11 in the display apparatus 100, and the parasitic capacitance charge-sharing circuit 13 can be controlled to electrically connect the corresponding two adjacent scan lines 11 with each other in at least part of time periods within the scan-period interval t2, so that parasitic capacitor charges on the former scan line 11 of the corresponding two adjacent scan lines 11 can be discharged to the latter scan line 11 of the corresponding two scan lines 11 through the parasitic capacitance charge-sharing circuit 13. This can not only solve abnormal display that is caused by parasitic capacitors, but also can achieve reuse of charges in the parasitic capacitors, thereby reducing the energy consumption, and the scan-period interval t2 can also be shortened, thereby improving the light-emitting efficiency.

Although the implementations of the disclosure have been illustrated and described above, those of ordinary skill in the art can understand that changes, modifications, replacements, and variations can be made to the above implementations without departing from the principles and purposes of the disclosure. The scope of the disclosure is defined by the claims and their equivalents.

What is claimed is:

1. A display apparatus, comprising N scan lines extending in a row direction and arranged in a column direction and N rows of sub-pixel units electrically connected to the N scan lines in one-to-one correspondence, the N scan lines being configured to sequentially receive scan signals according to a preset time sequence to perform progressive scan on the N rows of sub-pixel units, N being greater than or equal to two, wherein the display apparatus further comprises at least one parasitic capacitance charge-sharing circuit, wherein for each of the at least one parasitic capacitance charge-sharing circuit, the parasitic capacitance charge-sharing circuit is disposed between corresponding two adjacent scan lines, a time point at which a former scan line of the two adjacent scan lines completes reception of a scan signal precedes a time point at which a latter scan line of the two adjacent scan lines begins reception of a scan signal by a scan-period interval, and the parasitic capacitance charge-sharing circuit is configured to electrically connect the corresponding two adjacent scan lines with each other in at least part of time periods within the scan-period interval, so that parasitic capacitance charges on the former scan line of the corresponding two adjacent scan lines are discharged to the latter scan line of the corresponding two adjacent scan lines through the parasitic capacitance charge-sharing circuit;

a number of the at least one parasitic capacitance charge-sharing circuit is N−1, and one of the at least one parasitic capacitance charge-sharing circuits is disposed between each two adjacent scan lines;

each of the at least one the parasitic capacitance charge-sharing circuit comprises a switch module, the switch module is arranged between and connected to two adjacent scan lines corresponding to the parasitic capacitance charge-sharing circuit, and the switch module is configured to be switched on in at least part of time periods within the scan-period interval to electrically connect the two adjacent scan lines corresponding to the parasitic capacitance charge-sharing circuit with each other;

the switch module comprises a control terminal, a first connection terminal, and a second connection terminal, the first connection terminal of the switch module is electrically connected to the former scan line of the two adjacent scan lines corresponding to the parasitic capacitance charge-sharing circuit, and the second connection terminal of the switch module is electrically connected to the latter scan line of the two adjacent scan lines corresponding to the parasitic capacitance charge-sharing circuit; and the parasitic capacitance charge-sharing circuit further comprises a control circuit connected to the control terminal of the switch module of the parasitic capacitance charge-sharing circuit, wherein the control circuit is configured to detect a voltage difference between the two adjacent scan lines corresponding to the parasitic capacitance charge-sharing circuit and determine whether the scan-period interval for scanning the two adjacent scan lines corresponding to the parasitic capacitance charge-sharing circuit reaches, and to output a conduction signal to the control terminal of the switch module to switch the switch module on in response to that the voltage difference between the two adjacent scan lines meets a preset condition and the scan-period interval for scanning the two adjacent scan lines corresponding to the parasitic capacitance charge-sharing circuit reaches, to electrically connect the two adjacent scan lines with each other; wherein the preset condition is that a voltage of the former scan line of the two adjacent scan lines is higher than a voltage of the latter scan line of the two adjacent scan lines.

2. The display apparatus of claim 1, wherein the control circuit comprises:

a first voltage input terminal electrically connected to the former scan line of the two adjacent scan lines corresponding to the parasitic capacitance charge-sharing circuit;

a second voltage input terminal electrically connected to the latter scan line of the two adjacent scan lines corresponding to the parasitic capacitance charge-sharing circuit;

an enable-signal input terminal configured to receive a parasitic capacitance charge-sharing enable signal, wherein a level of the parasitic capacitance charge-sharing enable signal is a second level during reception of a scan signal by any scan line and is a first level within the scan-period interval; and a conduction signal output terminal electrically connected to the control terminal of the switch module of the parasitic capacitance charge-sharing circuit;

wherein the control circuit is configured to output the conduction signal to the control terminal of the switch module through the conduction signal output terminal to switch on the switch module of the parasitic capacitance charge-sharing circuit, in response to that the level of the parasitic capacitance charge-sharing enable signal received is the first level and a voltage of the first voltage input terminal is higher than a voltage of the second voltage input terminal.

3. The display apparatus of claim 2, wherein the control circuit further comprises a comparator, and the comparator comprises:
a non-inverting input terminal electrically connected to the first voltage input terminal;
an inverting input terminal electrically connected to the second voltage input terminal;
an enable terminal electrically connected to the enable-signal input terminal and configured to receive the parasitic capacitance charge-sharing enable signal; and
an output terminal electrically connected to the conduction signal output terminal;
wherein the comparator is configured to output a high level signal to the control terminal of the switch module through the output terminal in response to that the level of the parasitic capacitance charge-sharing enable signal received is the first level and a voltage of the non-inverting input terminal is higher than a voltage of the inverting input terminal, wherein the high level signal is the conduction signal.

4. The display apparatus of claim 2, further comprising:
N row-drive transistors corresponding to the N scan lines in one-to-one correspondence, wherein each of the N row-drive transistors comprises a first connection terminal, a second connection terminal, and a control terminal, the first connection terminal of each of the N row-drive transistors is electrically connected to a scan power supply, and the second connection terminal of each of the N row-drive transistors is electrically connected to a corresponding scan line; and
a row decoder comprising a plurality of decoding input terminals, a decoding enable terminal configured to receive a decoding enable signal, and N row-drive signal output terminals electrically connected to control terminals of the N row-drive transistors in one-to-one correspondence; the row decoder is configured to output N row-drive signals to the control terminals of the N row-drive transistors in one-to-one correspondence to sequentially turn the N row-drive transistors on according to a preset time sequence in response to that the decoding enable signal received is the second level, so that the N scan lines are sequentially electrically connected to the scan power supply through the row-drive transistors that are on to receive scan signals provided by the scan power supply;
wherein the decoding enable signal is configured to control a duration of a time interval between each two adjacent row-drive signals, and the parasitic capacitance charge-sharing enable signal serves as the decoding enable signal.

5. The display apparatus of claim 1, wherein the parasitic capacitance charge-sharing circuit is configured to electrically disconnect corresponding two adjacent scan lines from each other within a period from a time point at which a frame of display image begins to a time point at which the former scan line of the corresponding two adjacent scan lines completes reception of the scan signal, and within a period from a time point at which the latter scan line of the corresponding two adjacent scan lines begins reception of the scan signal to a time point at which the frame of display image ends.

6. The display apparatus of claim 1, wherein each of a plurality of frames of display images has a display period and a vertical blanking interval;

the display apparatus further comprises a reset transistor, wherein the reset transistor comprises a first connection terminal, a second connection terminal, and a control terminal, the first connection terminal of the reset transistor is electrically connected to one of the N scan lines, and the second connection terminal of the reset transistor is electrically connected to a bleeder power supply;
the reset transistor remains off during the display period; and
in at least part of periods within the vertical blanking interval, both the reset transistor and the switch module of each of the N−1 parasitic capacitance charge-sharing circuits are on, so that the N scan lines are electrically connected to the bleeder power supply through the reset transistor that is on and the switch modules that are onto discharge residual parasitic capacitance charges on the N scan lines.

7. An electronic device, comprising:
a housing;
a power supply module; and
a display apparatus, wherein the power supply module is electrically connected to the display apparatus, the power supply module is configured to power the display apparatus, and the housing is configured to fix the display apparatus and the power supply module;
wherein the display apparatus comprises N scan lines extending in a row direction and arranged in a column direction and N rows of sub-pixel units electrically connected to the N scan lines in one-to-one correspondence, the N scan lines are configured to sequentially receive scan signals according to a preset time sequence to perform progressive scan on the N rows of sub-pixel units, and N is greater than or equal to two;
wherein the display apparatus further comprises at least one parasitic capacitance charge-sharing circuit, wherein for each of the at least one parasitic capacitance charge-sharing circuit, the parasitic capacitance charge-sharing circuit is disposed between corresponding two adjacent scan lines, a time point at which a former scan line of the two adjacent scan lines completes reception of a scan signal precedes a time point at which a latter scan line of the two adjacent scan lines begins reception of a scan signal by a scan-period interval, and the parasitic capacitance charge-sharing circuit is configured to electrically connect the corresponding two adjacent scan lines with each other in at least part of time periods within the scan-period interval, so that parasitic capacitance charges on the former scan line of the corresponding two adjacent scan lines are discharged to the latter scan line of the corresponding two adjacent scan lines through the parasitic capacitance charge-sharing circuit;
wherein a number of the at least one parasitic capacitance charge-sharing circuit is N−1, and one of the at least one parasitic capacitance charge-sharing circuits is disposed between each two adjacent scan lines;
wherein each of the at least one the parasitic capacitance charge-sharing circuit comprises a switch module, the switch module is arranged between and connected to two adjacent scan lines corresponding to the parasitic capacitance charge-sharing circuit, and the switch module is configured to be switched on in at least part of time periods within the scan-period interval to electrically connect the two adjacent scan lines corresponding to the parasitic capacitance charge-sharing circuit with each other;

wherein the switch module comprises a control terminal, a first connection terminal, and a second connection terminal, the first connection terminal of the switch module is electrically connected to the former scan line of the two adjacent scan lines corresponding to the parasitic capacitance charge-sharing circuit, and the second connection terminal of the switch module is electrically connected to the latter scan line of the two adjacent scan lines corresponding to the parasitic capacitance charge-sharing circuit; and wherein the parasitic capacitance charge-sharing circuit further comprises a control circuit connected to the control terminal of the switch module of the parasitic capacitance charge-sharing circuit, wherein the control circuit is configured to detect a voltage difference between the two adjacent scan lines corresponding to the parasitic capacitance charge-sharing circuit and determine whether the scan-period interval for scanning the two adjacent scan lines corresponding to the parasitic capacitance charge-sharing circuit reaches, and to output a conduction signal to the control terminal of the switch module to switch the switch module on in response to that the voltage difference between the two adjacent scan lines meets a preset condition and the scan-period interval for scanning the two adjacent scan lines corresponding to the parasitic capacitance charge-sharing circuit reaches, to electrically connect the two adjacent scan lines with each other; wherein the preset condition is that a voltage of the former scan line of the two adjacent scan lines is higher than a voltage of the latter scan line of the two adjacent scan lines.

8. The electronic device of claim 7, wherein the control circuit comprises:
a first voltage input terminal electrically connected to the former scan line of the two adjacent scan lines corresponding to the parasitic capacitance charge-sharing circuit;
a second voltage input terminal electrically connected to the latter scan line of the two adjacent scan lines corresponding to the parasitic capacitance charge-sharing circuit;
an enable-signal input terminal configured to receive a parasitic capacitance charge-sharing enable signal, wherein a level of the parasitic capacitance charge-sharing enable signal is a second level during reception of a scan signal by any scan line and is a first level within the scan-period interval; and
a conduction signal output terminal electrically connected to the control terminal of the switch module of the parasitic capacitance charge-sharing circuit;
wherein the control circuit is configured to output the conduction signal to the control terminal of the switch module through the conduction signal output terminal to switch on the switch module of the parasitic capacitance charge-sharing circuit, in response to that the level of the parasitic capacitance charge-sharing enable signal received is the first level and a voltage of the first voltage input terminal is higher than a voltage of the second voltage input terminal.

9. The electronic device of claim 8, wherein the control circuit further comprises a comparator, and the comparator comprises:
a non-inverting input terminal electrically connected to the first voltage input terminal;
an inverting input terminal electrically connected to the second voltage input terminal;
an enable terminal electrically connected to the enable-signal input terminal and configured to receive the parasitic capacitance charge-sharing enable signal; and
an output terminal electrically connected to the conduction signal output terminal;
wherein the comparator is configured to output a high level signal to the control terminal of the switch module through the output terminal in response to that the level of the parasitic capacitance charge-sharing enable signal received is the first level and a voltage of the non-inverting input terminal is higher than a voltage of the inverting input terminal, wherein the high level signal is the conduction signal.

10. The electronic device of claim 8, further comprising:
N row-drive transistors corresponding to the N scan lines in one-to-one correspondence, wherein each of the N row-drive transistors comprises a first connection terminal, a second connection terminal, and a control terminal, the first connection terminal of each of the N row-drive transistors is electrically connected to a scan power supply, and the second connection terminal of each of the N row-drive transistors is electrically connected to a corresponding scan line; and
a row decoder comprising a plurality of decoding input terminals, a decoding enable terminal configured to receive a decoding enable signal, and N row-drive signal output terminals electrically connected to control terminals of the N row-drive transistors in one-to-one correspondence; the row decoder is configured to output N row-drive signals to the control terminals of the N row-drive transistors in one-to-one correspondence to sequentially turn the N row-drive transistors on according to a preset time sequence in response to that the decoding enable signal received is the second level, so that the N scan lines are sequentially electrically connected to the scan power supply through the row-drive transistors that are on to receive scan signals provided by the scan power supply;
wherein the decoding enable signal is configured to control a duration of a time interval between each two adjacent row-drive signals, and the parasitic capacitance charge-sharing enable signal serves as the decoding enable signal.

11. The electronic device of claim 7, wherein the parasitic capacitance charge-sharing circuit is configured to electrically disconnect corresponding two adjacent scan lines from each other within a period from a time point at which a frame of display image begins to a time point at which the former scan line of the corresponding two adjacent scan lines completes reception of the scan signal, and within a period from a time point at which the latter scan line of the corresponding two adjacent scan lines begins reception of the scan signal to a time point at which the frame of display image ends.

12. The electronic device of claim 7, wherein each of a plurality of frames of display images has a display period and a vertical blanking interval;
the display apparatus further comprises a reset transistor, wherein the reset transistor comprises a first connection terminal, a second connection terminal, and a control terminal, the first connection terminal of the reset transistor is electrically connected to one of the N scan lines, and the second connection terminal of the reset transistor is electrically connected to a bleeder power supply;

the reset transistor remains off during the display period; and in at least part of periods within the vertical blanking interval, both the reset transistor and the switch module of each of the N−1 parasitic capacitance charge-sharing circuits are on, so that the N scan lines are electrically connected to the bleeder power supply through the reset transistor that is on and the switch modules that are onto discharge residual parasitic capacitance charges on the N scan lines.

* * * * *